(12) United States Patent
Jiroku et al.

(10) Patent No.: US 11,588,300 B2
(45) Date of Patent: Feb. 21, 2023

(54) LIGHT EMITTING DEVICE, PROJECTOR, AND DISPLAY

(71) Applicants: Seiko Epson Corporation, Tokyo (JP); Sophia School Corporation, Tokyo (JP)

(72) Inventors: Hiroaki Jiroku, Suwa (JP); Katsumi Kishino, Akiruno (JP)

(73) Assignees: SEIKO EPSON CORPORATION; SOPHIA SCHOOL CORPORATION

( * ) Notice: Subject to any disclaimer, the term of this patent is extended or adjusted under 35 U.S.C. 154(b) by 244 days.

(21) Appl. No.: 17/082,475

(22) Filed: Oct. 28, 2020

(65) Prior Publication Data

US 2021/0126434 A1 Apr. 29, 2021

(30) Foreign Application Priority Data

Oct. 29, 2019 (JP) .............................. JP2019-195936

(51) Int. Cl.
*H01S 5/11* (2021.01)
*H01S 5/34* (2006.01)
(Continued)

(52) U.S. Cl.
CPC .......... *H01S 5/341* (2013.01); *H01S 5/04256* (2019.08); *H01S 5/11* (2021.01);
(Continued)

(58) Field of Classification Search
CPC ... H01S 5/11; H01S 5/18; H01S 5/185; H01S 5/04256; H01S 5/341
See application file for complete search history.

(56) References Cited

U.S. PATENT DOCUMENTS

2012/0170126 A1* 7/2012 Imaoku .................. G02B 1/118
359/601
2019/0267775 A1* 8/2019 Noda .................... H01S 5/0425
(Continued)

FOREIGN PATENT DOCUMENTS

JP 2007-049062 A 2/2007
JP 2008-004662 A 1/2008
(Continued)

OTHER PUBLICATIONS

Y. Handa et al., "Moth Eye Sheet Which Does Not Reflect Light", Kawasaki Science World, Issued Apr. 1, 2014 (72 Pages) with partial English translation.

*Primary Examiner* — Michael Carter
(74) *Attorney, Agent, or Firm* — Harness, Dickey & Pierce, P.L.C.

(57) ABSTRACT

The light emitting device includes a substrate, and a laminated structure provided to the substrate, and including a plurality of columnar parts, wherein the columnar part includes a first semiconductor layer, a second semiconductor layer different in conductivity type from the first semiconductor layer, and a light emitting layer disposed between the first semiconductor layer and the second semiconductor layer, the laminated structure includes a third semiconductor layer which is connected to an opposite side to the substrate of the second semiconductor layer, and is same in conductivity type as the second semiconductor layer, the second semiconductor layer is disposed between the light emitting layer and the third semiconductor layer, the third semiconductor layer is provided with a recessed part, an opening of the recessed part is provided to a surface at an opposite side to the substrate side of the third semiconductor layer, and a diametrical size in a bottom of the recessed part is smaller than a diametrical size in the opening of the recessed part.

16 Claims, 5 Drawing Sheets

(51) Int. Cl.
- *H01S 5/042* (2006.01)
- *H01S 5/185* (2021.01)
- *G03B 21/20* (2006.01)
- *H01S 5/343* (2006.01)

(52) U.S. Cl.
CPC .......... *H01S 5/185* (2021.01); *G03B 21/2033* (2013.01); *H01S 5/34333* (2013.01)

(56) References Cited

U.S. PATENT DOCUMENTS

2020/0266611 A1* 8/2020 Nagawa .............. H01S 5/34333
2020/0274330 A1 8/2020 Nagawa et al.

FOREIGN PATENT DOCUMENTS

| | | |
|---|---|---|
| JP | 2014-067945 A | 4/2014 |
| JP | 2019-054127 A | 4/2019 |
| JP | 2019-083232 A | 5/2019 |
| WO | 2010-087231 A1 | 8/2010 |
| WO | WO-2010087231 A1 * | 8/2010 ............. H01S 5/187 |

* cited by examiner

LIGHT EMITTING DEVICE, PROJECTOR, AND DISPLAY

The present application is based on, and claims priority from JP Application Serial Number 2019-195936, filed Oct. 29, 2019, the disclosure of which is hereby incorporated by reference herein in its entirety.

BACKGROUND

1. Technical Field

The present disclosure relates to a light emitting device, a projector, and a display.

2. Related Art

Semiconductor lasers are promising as high-luminance next-generation light sources. In particular, the semiconductor laser having a nano-structure called a nano-column, a nano-wire, a nano-rod, a nano-pillar, or the like is expected to realize a light emitting device capable of obtaining narrow-radiation angle and high-power light emission due to an effect of a photonic crystal.

In, for example, JP-A-2007-49062 (Document 1), there is disclosed a light emitting diode which is obtained by forming an n-type GaN nano-column layer and a light emitting layer on a silicon substrate, then growing a p-type GaN contact layer epitaxially while increasing the nano-column diameter, and then forming a semi-transparent p-type electrode on the p-type GaN contact layer, and in which the n-type GaN nano-column layer is provided with an absorption/re-emission layer realized by a multiple quantum well structure or a double heterostructure to improve the light extraction efficiency.

In such a light emitting device having the nano-columns as described above, it is necessary to consider conditions such as grating matching based on a material of the light emitting layer and a material of the substrate, and the choice of the materials is significantly limited. Therefore, it is difficult to take a difference in refractive index between an active layer and a cladding layer, and the light generated in, for example, the active layer is leaked toward an electrode to be absorbed in the electrode to cause a loss. Further, in such a light emitting device, as disclosed in Document 1, it is required to improve the light extraction efficiency.

SUMMARY

A light emitting device according to an aspect of the present disclosure includes a substrate, and a laminated structure provided to the substrate, and including a plurality of columnar parts, wherein the columnar part includes a first semiconductor layer, a second semiconductor layer different in conductivity type from the first semiconductor layer, and a light emitting layer disposed between the first semiconductor layer and the second semiconductor layer, the laminated structure includes a third semiconductor layer which is connected to an opposite side to the substrate of the second semiconductor layer, and is same in conductivity type as the second semiconductor layer, the second semiconductor layer is disposed between the light emitting layer and the third semiconductor layer, the third semiconductor layer is provided with a recessed part, an opening of the recessed part is provided to a surface at an opposite side to the substrate side of the third semiconductor layer, and a diametrical size in a bottom of the recessed part is smaller than a diametrical size in the opening of the recessed part.

In the light emitting device according to the aspect, an electrode may be disposed at an opposite side to the substrate side of the laminated structure.

In the light emitting device according to the aspect, a through hole penetrating the electrode may be disposed at a position of the electrode overlapping the recessed part when viewed from a stacking direction of the laminated structure.

In the light emitting device according to the aspect, a plurality of the recessed parts may be provided, the plurality of columnar parts may be arranged in a first direction at a first pitch, the plurality of the recessed parts may be arranged in a second direction at a second pitch, the first direction may be a direction in which the columnar parts are arranged at a shortest pitch, the second direction may be a direction in which the recessed parts are arranged at a shortest pitch, and the second pitch may be shorter than the first pitch.

In the light emitting device according to the aspect, the diametrical size in the opening of the recessed part may be smaller than a diametrical size of the columnar part.

In the light emitting device according to the aspect, a shape of the recessed part may be one of a circular cone and a pyramidal shape.

In the light emitting device according to the aspect, a diametrical size of the recessed part may decrease in a direction from the opening of the recessed part toward the bottom of the recessed part.

A projector according to another aspect of the present disclosure includes the light emitting device described above.

A display according to another aspect of the present disclosure includes the light emitting device described above.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment

1.1. Light Emitting Device

Figure 1:
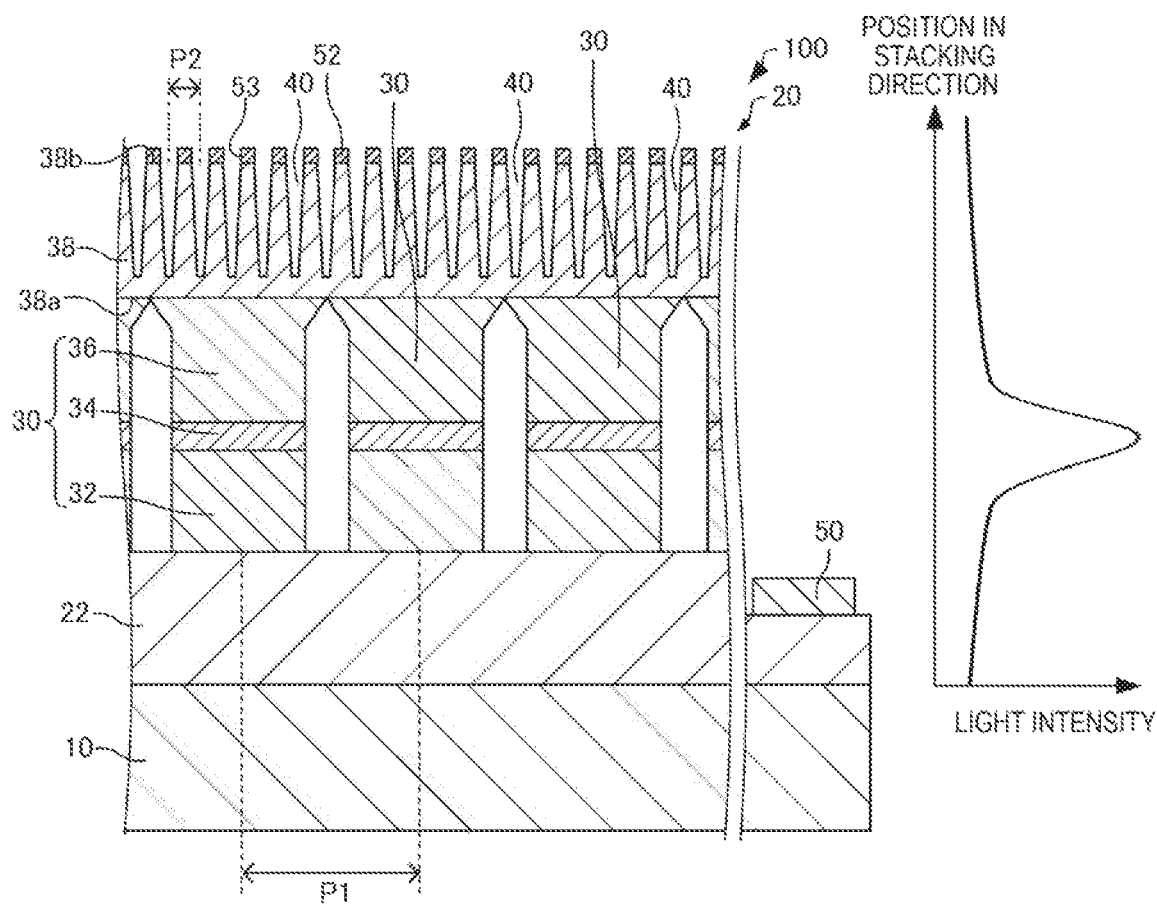
FIG. 1 is a cross-sectional view schematically showing a light emitting device according to a first embodiment.
Figure 2:
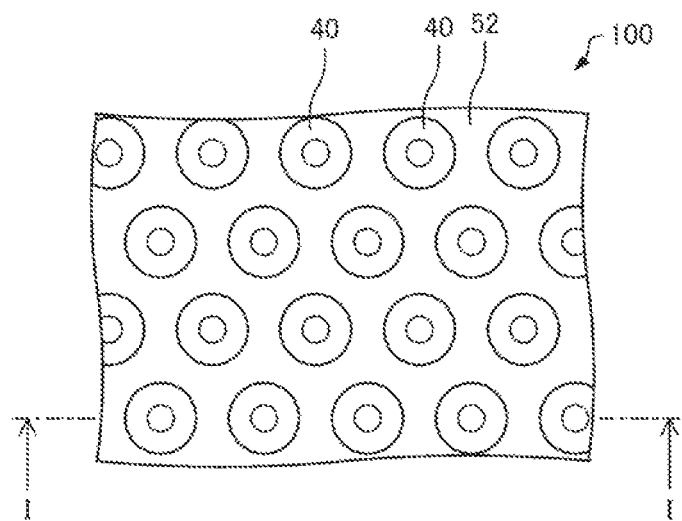
FIG. 2 is a plan view schematically showing the light emitting device according to the first embodiment.

Firstly, a light emitting device according to a first embodiment will be described with reference to the drawings. FIG. 1 is a cross-sectional view schematically showing the light emitting device 100 according to the first embodiment. FIG. 2 is a plan view schematically showing the light emitting device 100 according to the first embodiment. It should be noted that FIG. 1 is a cross-sectional view along the line I-I shown in FIG. 2.

The light emitting device 100 has a substrate 10, a laminated structure 20, a first electrode 50, and a second electrode 52.

The substrate 10 has, for example, a plate-like shape. The substrate 10 is, for example, an Si substrate, a GaN substrate, or a sapphire substrate.

The laminated structure 20 is provided to the substrate 10. The laminated structure 20 has, for example, a buffer layer 22 and a plurality of columnar parts 30.

It should be noted that in the present specification, when taking a light emitting layer 34 as a reference in the stacking direction (hereinafter also referred to simply as a "stacking direction") of the laminated structure 20, the description will be presented assuming a direction from the light emitting layer 34 toward the second semiconductor layer 36 as an "upward direction," and a direction from the light emitting layer 34 toward a first semiconductor layer 32 as a "downward direction." Further, the "stacking direction of the laminated structure" denotes a stacking direction of the first semiconductor layer 32 and the light emitting layer 34.

The buffer layer 22 is disposed on the substrate 10. The buffer layer 22 is, for example, an Si-doped n-type GaN layer.

The columnar parts 30 are disposed on the buffer layer 22. The columnar parts 30 each have a columnar shape protruding upward from the buffer layer 22. The columnar part 30 is also referred to as, for example, a nano-column, a nano-wire, a nano-rod, or a nano-pillar. A cross-sectional shape of the columnar part 30 in a direction perpendicular to the stacking direction is, for example, a polygon or a circle.

The diametrical size of the columnar part 30 is, for example, no smaller than 50 nm and no larger than 250 nm. By setting the diametrical size of the columnar part 30 to be no larger than 250 nm, it is possible to obtain the light emitting layer 34 made of crystals high in quality, and at the same time, it is possible to reduce the distortion inherent in the light emitting layer 34. Thus, it is possible to amplify the light generated in the light emitting layer 34 with high efficiency. The columnar parts 30 are, for example, equal in diametrical size to each other.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum enclosing circle. For example, when the planar shape of the columnar part 30 is a polygonal shape, the diametrical size of the columnar part is the diameter of a minimum circle including the polygonal shape inside, and when the planar shape of the columnar part 30 is an ellipse, the diametrical size of the columnar part 30 is the diameter of a minimum circle including the ellipse inside.

The number of the columnar parts 30 disposed is two or more. An interval between the columnar parts 30 adjacent to each other is, for example, no smaller than 1 nm and no larger than 250 nm. The columnar parts 30 are arranged at a first pitch P1 in a first direction in a plan view (hereinafter also referred to simply as "in the plan view") viewed from the stacking direction. The first direction is a direction in which the columnar parts 30 are arranged at the shortest pitch. The plurality of columnar parts 30 is arranged so as to form, for example, a triangular grid or a quadrangular grid. The plurality of columnar parts 30 can develop an effect of a photonic crystal.

It should be noted that the "pitch of the columnar parts" is a distance between the centers of the columnar parts 30 adjacent to each other along the first direction. When the planar shape of the columnar part 30 is a circle, the "center of the columnar part" means the center of the circle, and when the planar shape of the columnar part 30 is not a circular shape, the "center of the columnar part" means the center of the minimum enclosing circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

The columnar parts 30 each have the first semiconductor layer 32, the light emitting layer 34, and the second semiconductor layer 36.

The first semiconductor layer 32 is disposed on the buffer layer 22. The first semiconductor layer 32 is disposed between the substrate 10 and the light emitting layer 34. The first semiconductor layer 32 is an n-type semiconductor layer. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layers 36. The light emitting layer 34 emits light in response to injection of an electrical current. The light emitting layer 34 has a multiple quantum well structure obtained by stacking quantum well structures each constituted by, for example, an i-type GaN layer doped with no impurity and an i-type InGaN layer.

The second semiconductor layer 36 is disposed on the light emitting layer 34. The second semiconductor layer 36 is disposed between the light emitting layer 34 and the third semiconductor layer 38. The second semiconductor layer 36 is a layer different in conductivity type from the first semiconductor layer 32. The second semiconductor layer 36 is a p-type semiconductor layer. The second semiconductor layer 36 is, for example, an Mg-doped p-type GaN layer. The first semiconductor layer 32 and the second semiconductor layer 36 are cladding layers having a function of confining the light in the light emitting layer 34.

Between the columnar parts 30 adjacent to each other, there is, for example, an air gap. It should be noted that it is also possible to dispose a light propagation layer between the columnar parts 30 adjacent to each other. The light propagation layer is, for example, a silicon oxide layer, an aluminum oxide layer, or a titanium oxide layer. It is possible for the light generated in the light emitting layer 34 to pass through the light propagation layers to propagate through the plurality of columnar parts 30 in a direction perpendicular to the stacking direction.

The laminated structure 20 further includes a third semiconductor layer 38. The third semiconductor layer 38 is disposed on the second semiconductor layer 36. The third semiconductor layer 38 is connected to an opposite side to the substrate 10 of the second semiconductor layer 36. The third semiconductor layer 38 is a layer the same in conductivity type as the second semiconductor layer 36. The third semiconductor layer 38 is a p-type semiconductor layer. The third semiconductor layer 38 is, for example, an Mg-doped p-type GaN layer. The third semiconductor layer is, for example, a contact layer, and the second electrode 52 has contact with the third semiconductor layer 38. The material of the third semiconductor layer 38 can be the same as the material of the second semiconductor layer 36.

The third semiconductor layer 38 is a single layer disposed so as to straddle the plurality of columnar parts 30. In other words, the third semiconductor layer 38 does not constitute the columnar part 30.

Figure 3:
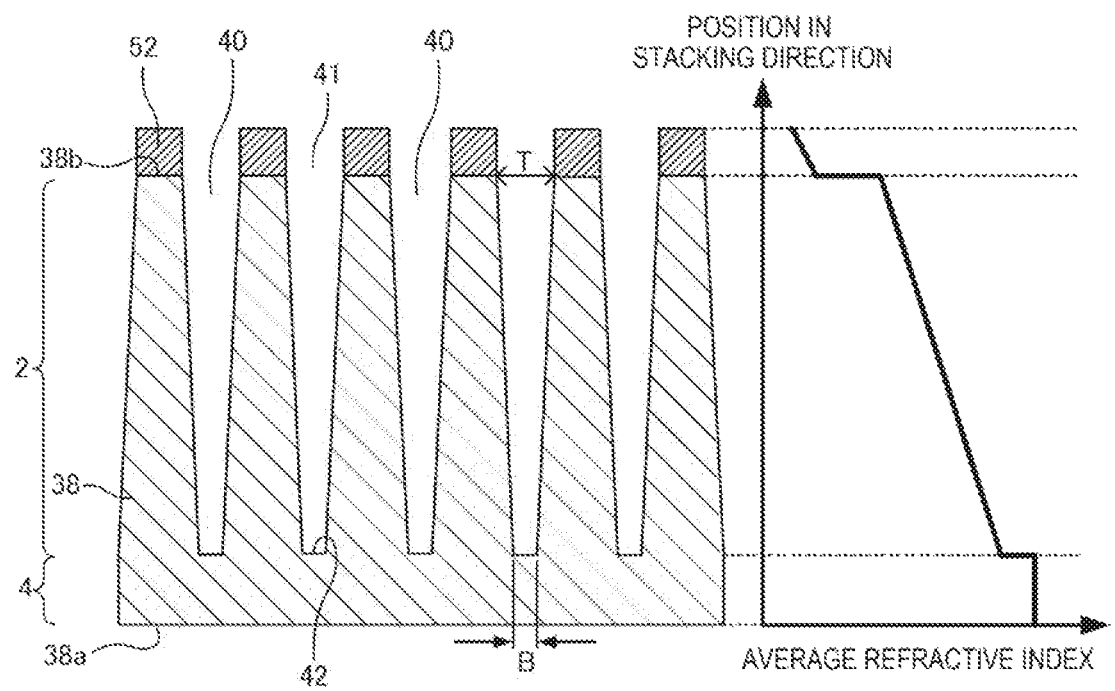
FIG. 3 is a cross-sectional view schematically showing a third semiconductor layer of the light emitting device according to the first embodiment.

FIG. 3 is a cross-sectional view schematically showing the third semiconductor layer 38 of the light emitting device 100. It should be noted that in FIG. 3, there is further illustrated a graph representing the distribution of the average refractive index of the third semiconductor layer 38 in the stacking direction. The average refractive index is an average of the refractive index in the in-plane direction of the third semiconductor layer 38.

The third semiconductor layer 38 has a first surface 38a on the substrate 10 side, and a second surface 38b located at the opposite side to the first surface 38a. The second surface 38b of the third semiconductor layer 38 is a flat surface. The third semiconductor layer 38 is provided with a plurality of recessed parts 40.

The planar shape of the recessed part 40 is a circle as shown in FIG. 2. In other words, the shape of an opening 41 of the recessed part 40 is a circle. It should be noted that the planar shape of the recessed part 40 is not particularly limited, and can also be a polygonal shape, an ellipse, or the like. The planar shape of the recessed part 40 means a shape of the recessed part 40 viewed from the stacking direction.

As shown in FIG. 3, the diametrical size B in a bottom 42 of the recessed part 40 is smaller than the diametrical size T in the opening 41 of the recessed part 40. The diametrical size T of the recessed part 40 is a diametrical size of the recessed part 40 in the second surface 38b. The diametrical size T of the recessed part 40 is, for example, no smaller than 5 nm and no larger than 100 nm. The diametrical size of the recessed part 40 decreases in a direction from the opening 41 toward the bottom 42. The shape of the recessed part 40 is, for example, a circular truncated cone or a truncated pyramid. The diametrical size T of the recessed part 40 is, for example, smaller than the diametrical size of the columnar part 30.

It should be noted that when the planar shape of the recessed part 40 is a circle, the "diametrical size of the recessed part" means the diameter of the circle, and when the planar shape of the recessed part 40 is not a circular shape, the "diametrical size of the recessed part" means the diameter of the minimum enclosing circle. For example, when the planar shape of the recessed part 40 is a polygonal shape, the diametrical size of the recessed part is the diameter of a minimum circle including the polygonal shape inside, and when the planar shape of the recessed part 40 is an ellipse, the diametrical size of the recessed part is the diameter of a minimum circle including the ellipse inside.

As shown in FIG. 1, the recessed parts 40 are arranged in a second direction at a second pitch P2. The second direction is a direction in which the recessed parts 40 are arranged at the shortest pitch. The second pitch P2 is shorter than the first pitch P1. An interval between the recessed parts 40 adjacent to each other is, for example, no smaller than 5 nm and no larger than 500 nm. The plurality of recessed parts 40 is arranged to form, for example, a triangular grid or a quadrangular grid.

The "pitch of the recessed parts" means a distance between the centers of the recessed parts 40 adjacent to each other along the second direction. When the planar shape of the recessed part 40 is a circle, the "center of the recessed part" means the center of the circle, and when the planar shape of the recessed part 40 is not a circular shape, the "center of the recessed part" means the center of the minimum enclosing circle. For example, when the planar shape of the recessed part 40 is a polygonal shape, the center of the recessed part 40 is the center of a minimum circle including the polygonal shape inside, and when the planar shape of the recessed part 40 is an ellipse, the center of the recessed part 40 is the center of a minimum circle including the ellipse inside.

It should be noted that the recessed parts 40 can randomly be disposed in the third semiconductor layer 38. Thus, it is possible to prevent the recessed parts 40 from developing the effect of the photonic crystal.

The depth of the recessed part 40 is, for example, smaller than the thickness of the third semiconductor layer 38. The depth of the recessed part 40 is the size of the recessed part 40 in the stacking direction, and is a distance between the opening 41 and the bottom 42. The depth of the recessed part 40 can be 5 times or more as large as the diametrical size T of the recessed part 40.

The inside of the recessed part 40 is, for example, an air gap. It should be noted that it is also possible for the inside of the recessed part 40 to be a low-refractive index part made of a low-refractive index material lower in refractive index than the third semiconductor layer 38.

The first electrode 50 is disposed on the buffer layer 22. It is also possible for the buffer layer 22 to have ohmic contact with the first electrode 50. The first electrode 50 is electrically connected to the first semiconductor layer 32. In the illustrated example, the first electrode 50 is electrically connected to the first semiconductor layer 32 via the buffer layer 22. The first electrode 50 is one of the electrodes for injecting the electrical current into the light emitting layer 34. As the first electrode 50, there is used, for example, what is obtained by stacking a Cr layer, an Ni layer, and an Au layer in this order from the buffer layer 22 side.

The second electrode 52 is disposed at the opposite side to the substrate 10 side of the laminated structure 20. In the illustrated example, the second electrode 52 is disposed on the second surface 38b of the third semiconductor layer 38. The second electrode 52 is provided with through holes 53 at positions overlapping the recessed parts 40 when viewed from the stacking direction. In other words, the opening 41 of the recessed part 40 is not blocked by the second electrode 52. The second electrode 52 is not disposed inside the recessed part 40. The second electrode 52 is not disposed on the surface of the third semiconductor layer 38 defining the recessed part 40.

The second electrode 52 is electrically connected to the third semiconductor layer 38. The second electrode is electrically connected to the second semiconductor layer 36 via the third semiconductor layer 38. The second electrode 52 is the other of the electrodes for injecting the electrical current into the light emitting layer 34. As the second electrode 52, there is used, for example, ITO (indium tin oxide). The film thickness of the second electrode 52 is, for example, no smaller than 100 nm and no larger than 300 nm.

It should be noted that although not shown in the drawings, it is possible to dispose a metal film for reducing the contact resistance between the third semiconductor layer 38 and the second electrode 52.

In the light emitting device 100, a pin diode is constituted by the second semiconductor layer 36 of the p-type, the light emitting layer 34, and the first semiconductor layer 32 of the n-type. In the light emitting device 100, when applying a forward bias voltage of the pin diode between the first electrode 50 and the second electrode 52, the electrical current is injected into the light emitting layer 34, and recombination of electrons and holes occurs in the light emitting layer 34. The recombination causes light emission. The light generated in the light emitting layer 34 propagates in a direction perpendicular to the stacking direction due to the first semiconductor layer 32 and the second semiconductor layer 36 to form a standing wave due to the effect of the photonic crystal caused of the plurality of columnar parts 30, and then causes laser oscillation receiving a gain in the light emitting layer 34. Then, the light emitting device 100 emits positive first-order diffracted light and negative first-order diffracted light as a laser beam in the stacking direction.

Here, in the light emitting device 100, the third semiconductor layer 38 is provided with the recessed parts 40. Therefore, in the light emitting device 100, it is possible to reduce the light loss due to the second electrode 52. Further, in the light emitting device 100, the diametrical size B in the bottom 42 of the recessed part is smaller than the diametrical size T in the second surface 38b of the recessed part 40. Therefore, in the light emitting device 100, it is possible to increase the light extraction efficiency. Hereinafter, the reason therefor will be described.

Figure 4:
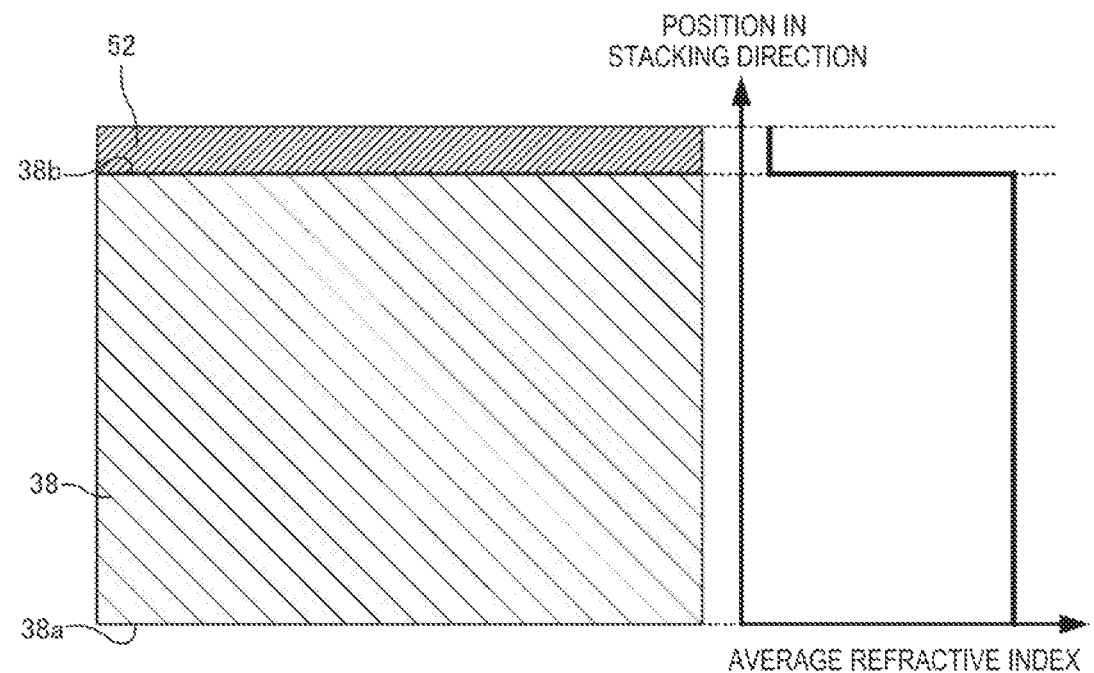
FIG. 4 is a cross-sectional view schematically showing a third semiconductor layer of a light emitting device according to a first reference example.

FIG. 4 is a cross-sectional view schematically showing the third semiconductor layer 38 of a light emitting device according to a first reference example. It should be noted that FIG. 4 corresponds to FIG. 3, and the first reference example shown in FIG. 4 is difference from the example shown in FIG. 3 in the point that the third semiconductor layer 38 fails to be provided with the recessed parts 40.

As shown in FIG. 3, in the light emitting device 100, by providing the recessed parts 40 to the third semiconductor layer 38, it is possible to decrease the average refractive index in the vicinity of the second electrode 52 of the third semiconductor layer 38 compared to when the third semiconductor layer 38 fails to be provided with the recessed parts 40 as shown in FIG. 4. Therefore, in the light emitting device 100, it is possible to enhance the effect of confining the light in the vicinity of the light emitting layer 34, and it is possible to reduce the leakage of the light generated in the light emitting layer 34 toward the second electrode 52. Therefore, in the light emitting device 100, it is possible to reduce the absorption of the light by the second electrode 52, and thus, it is possible to reduce the loss of the light due to the second electrode 52. As a result, as shown in FIG. 1, in the light emitting device 100, it is possible to locate a peak of the light intensity in the light emitting layer 34.

Figure 5:
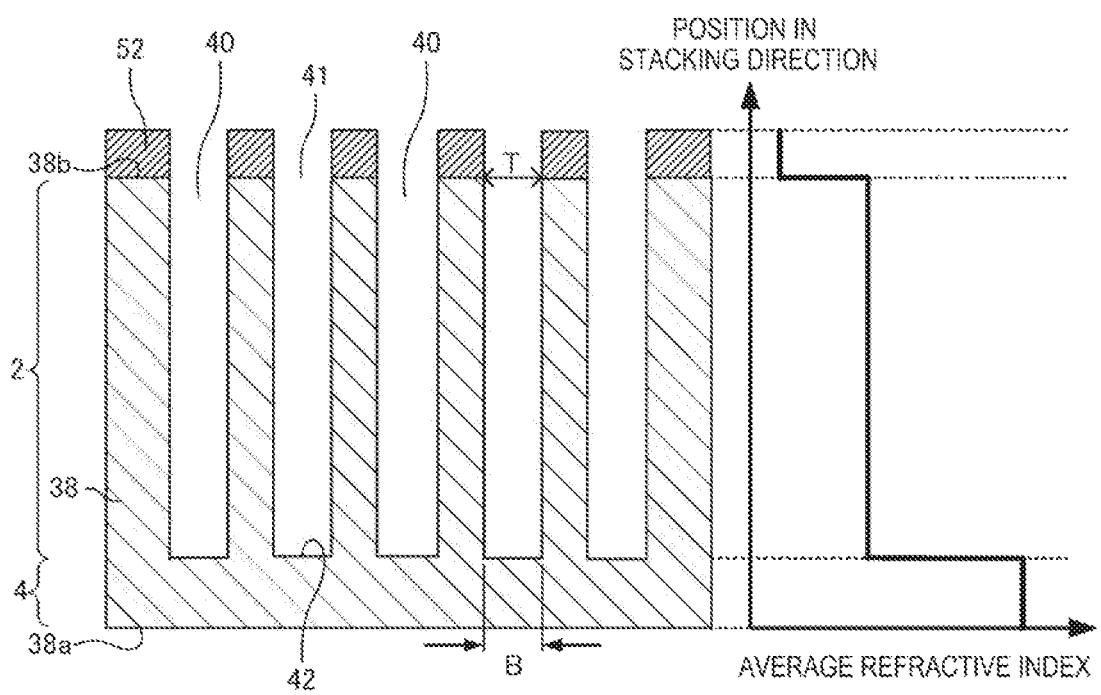
FIG. 5 is a cross-sectional view schematically showing a third semiconductor layer of a light emitting device according to a second reference example.

FIG. 5 is a cross-sectional view schematically showing the third semiconductor layer 38 of a light emitting device according to a second reference example. It should be noted that FIG. 5 corresponds to FIG. 3, and the second reference example shown in FIG. 5 is difference from the example shown in FIG. 3 in the point that the diametrical size B in the bottom 42 of the recessed part 40 and the diametrical size T in the second surface 38b of the recessed part 40 are equal to each other.

As shown in FIG. 5, when the diametrical size B in the bottom 42 of the recessed part 40 and the diametrical size T in the second surface 38b of the recessed part 40 are equal to each other, namely when the diametrical size of the recessed part 40 is constant from the opening 41 to the bottom 42, the variation in average refractive index in the boundary between an area 2 where the recessed parts 40 are disposed and an area 4 where the recessed parts 40 are not disposed is great in the third semiconductor layer 38. Therefore, the reflectance in the boundary becomes high, and thus, the extraction efficiency of the light which is generated in the light emitting layer 34, and then emitted in the stacking direction decreases.

In contrast, in the light emitting device 100, as shown in FIG. 3, the diametrical size B in the bottom 42 of the recessed part 40 is smaller than the diametrical size T in the second surface 38b of the recessed part 40. Therefore, in the light emitting device 100, the variation in average refractive index in the boundary between the area 2 where the recessed parts 40 are disposed and the area 4 where the recessed parts 40 are not disposed can be made small compared to when the diametrical size B in the bottom 42 of the recessed part 40 and the diametrical size T in the second surface 38b of the recessed part 40 are equal to each other as shown in FIG. 5.

Specifically, in the light emitting device 100, as shown in FIG. 3, the diametrical size of the recessed part 40 decreases in the direction from the opening 41 toward the bottom 42. Therefore, the average refractive index gradually increases in the direction from the opening toward the bottom 42. Therefore, the variation in average refractive index in the boundary between the area 2 where the recessed parts 40 are disposed and the area 4 where the recessed parts 40 are not disposed is small.

As described above, in the light emitting device 100, since the variation in average refractive index in the boundary between the area 2 where the recessed parts 40 are disposed and the area 4 where the recessed parts 40 are not disposed can be made small, it is possible to reduce the reflectance of the third semiconductor layer 38 with respect to the light which is generated in the light emitting layer 34 and then emitted in the stacking direction. Therefore, in the light emitting device 100, it is possible to efficiently emit the light generated in the light emitting layer 34 in the stacking direction.

Further, in the light emitting device 100, since the diametrical size of the recessed part 40 decreases in the direction from the opening 41 toward the bottom 42, the average refractive index gradually increases in the direction from the opening 41 toward the bottom 42. Thus, it is possible to reduce the reflectance of the third semiconductor layer 38 with respect to the light which is generated in the light emitting layer 34, and then emitted in the stacking direction. In other words, in the third semiconductor layer 38, by providing the recessed parts 40, it is possible to realize a moth-eye structure of reducing the reflectance by continuously changing the refractive index. Therefore, in the light emitting device 100, it is possible to efficiently emit the light generated in the light emitting layer 34 in the stacking direction.

It should be noted that although the light emitting layer 34 of the InGaN type is described above, as the light emitting layer 34, there can be used a variety of types of material types capable of emitting light in response to an electrical current injected in accordance with the wavelength of the light to be emitted. It is possible to use semiconductor materials of, for example, an AlGaN type, an AlGaAs type, an InGaAs type, an InGaAsP type, an InP type, a GaP type, or an AlGaP type.

1.2. Advantages

In the light emitting device 100, the third semiconductor layer 38 is provided with the recessed parts 40, and the diametrical size B in the bottom 42 of the recessed part 40 is smaller than the diametrical size T in the opening 41 of the recessed part 40. Therefore, in the light emitting device 100, as described above, it is possible to reduce the light loss due to the second electrode 52, and at the same time, it is possible to increase the light extraction efficiency.

In the light emitting device 100, the through holes 53 penetrating the second electrode 52 are disposed at the positions overlapping the recessed parts 40 of the second electrode 52 when viewed from the stacking direction. Therefore, in the light emitting device 100, it is possible to increase the light extraction efficiency compared to when the through holes 53 are not provided to the second electrode 52.

In the light emitting device 100, the plurality of columnar parts 30 is arranged in the first direction at the first pitch P1, the plurality of recessed parts 40 is arranged in the second direction at the second pitch P2, and the second pitch P2 is shorter than the first pitch P1. Thus, it is possible to reduce the influence of the plurality of recessed parts 40 exerted on the effect of the photonic crystal developed by the plurality of columnar parts 30. When, for example, the first pitch P1 and the second pitch P2 are equal to each other, the influence of the plurality of recessed parts 40 exerted on the effect of the photonic crystal developed by the plurality of columnar parts 30 becomes significant.

In the light emitting device 100, the diametrical size T in the opening 41 of the recessed part 40 is smaller than the diametrical size of the columnar part 30. Thus, it is possible to reduce the influence of the plurality of recessed parts 40 exerted on the effect of the photonic crystal developed by the plurality of columnar parts 30. When, for example, the diametrical size T and the diametrical size of the columnar part 30 are equal to each other, the influence of the plurality of recessed parts 40 exerted on the effect of the photonic crystal developed by the plurality of columnar parts 30 becomes significant.

In the light emitting device 100, the diametrical size of the recessed part 40 decreases in the direction from the opening 41 toward the bottom 42. Thus, as described above, since it is possible to gradually vary the average refractive index from the opening 41 of the recessed part 40 to the bottom 42 of the recessed part 40, it is possible to reduce the reflectance of the third semiconductor layer 38, and thus, it is possible to further increase the light extraction efficiency.

1.3. Manufacturing Method

Figure 6:
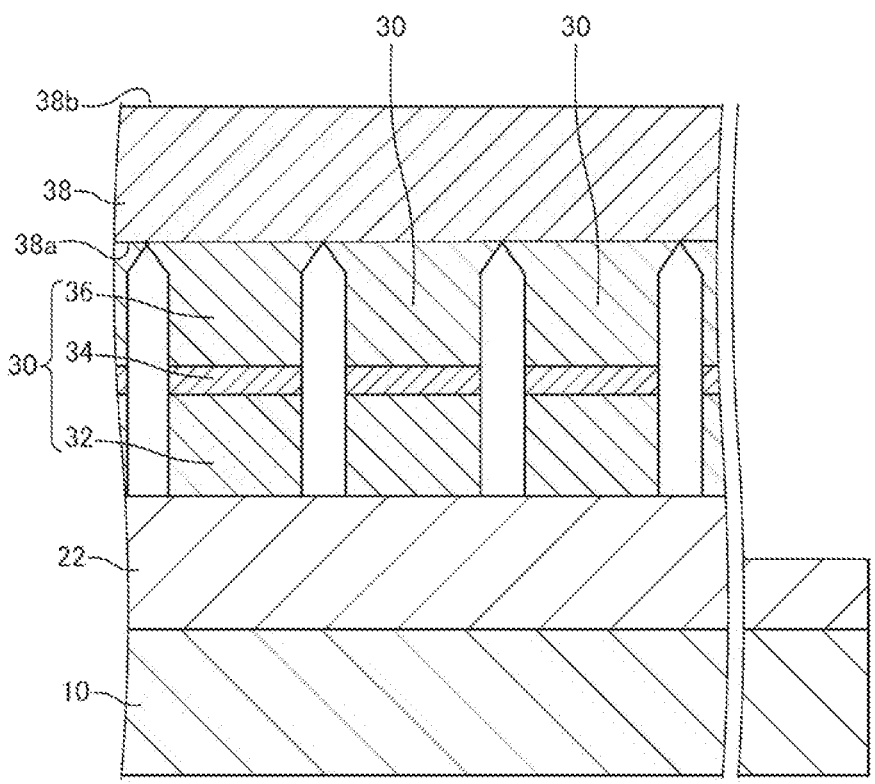
FIG. 6 is a cross-sectional view schematically showing a manufacturing process of the light emitting device according to the first embodiment.

Then, a method of manufacturing the light emitting device 100 according to the first embodiment will be described with reference to the drawings. FIG. 6 is a cross-sectional view schematically showing a manufacturing process of the light emitting device 100 according to the first embodiment.

As shown in FIG. 6, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, a mask layer is formed on the buffer layer 22, and then the first semiconductor layer 32, the light emitting layer 34, and the second semiconductor layer 36 are grown epitaxially on the buffer layer 22 using the mask layer as a mask. As the method of achieving the epitaxial growth, there can be cited, for example, the MOCVD method and the MBE method. Thus, the columnar parts 30 are formed.

Then, the third semiconductor layer 38 is grown epitaxially on the columnar parts 30. On this occasion, the third semiconductor layer 38 is formed so as to be a layer straddling the plurality of columnar parts 30.

It should be noted that it is possible to epitaxially grow, for example, the second semiconductor layer 36 and the third semiconductor layer 38 in series. In this case, it is possible to form the third semiconductor layer 38 by controlling the growth temperature to thereby shorten the distance between the columnar parts 30 adjacent to each other as the second semiconductor layer 36 grows, and then finally connect the columnar parts 30 adjacent to each other.

Then, as shown in FIG. 1, the first electrode 50 is formed on the buffer layer 22, and the second electrode 52 is formed on the third semiconductor layer 38. The first electrode 50 and the second electrode 52 are formed using, for example, a vacuum deposition method. It should be noted that the order of forming the first electrode 50 and the second electrode 52 is not particularly limited.

Then, a mask layer is formed on the second semiconductor layer 52, and then the second electrode 52 and the third semiconductor layer 38 are etched using the mask layer as a mask to form the through holes 53 in the second electrode 52 and form the recessed parts 40 in the third semiconductor layer 38. On this occasion, the etching condition is set so that the diametrical size of the recessed part 40 decreases in the direction from the opening 41 toward the bottom 42. The etching of the second electrode 52 and the third semiconductor layer 38 is performed using, for example, dry etching.

Due to the process described hereinabove, it is possible to manufacture the light emitting device 100.

2. Second Embodiment

Figure 7:
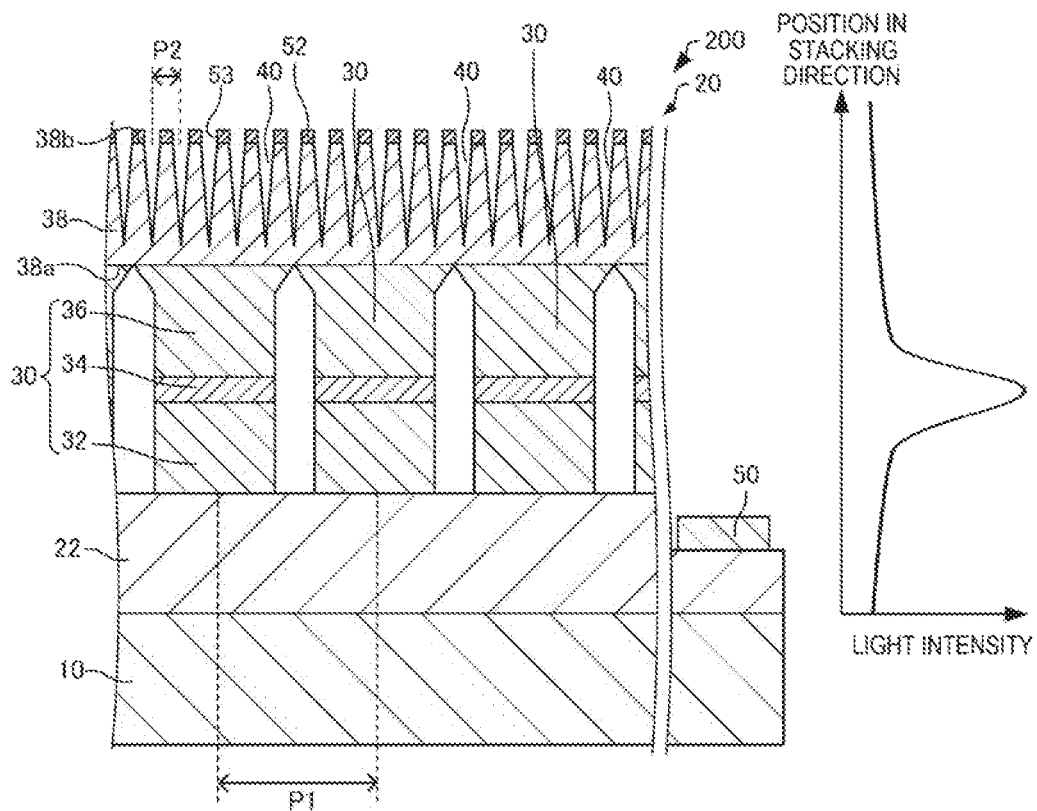
FIG. 7 is a cross-sectional view schematically showing a light emitting device according to a second embodiment.
Figure 8:
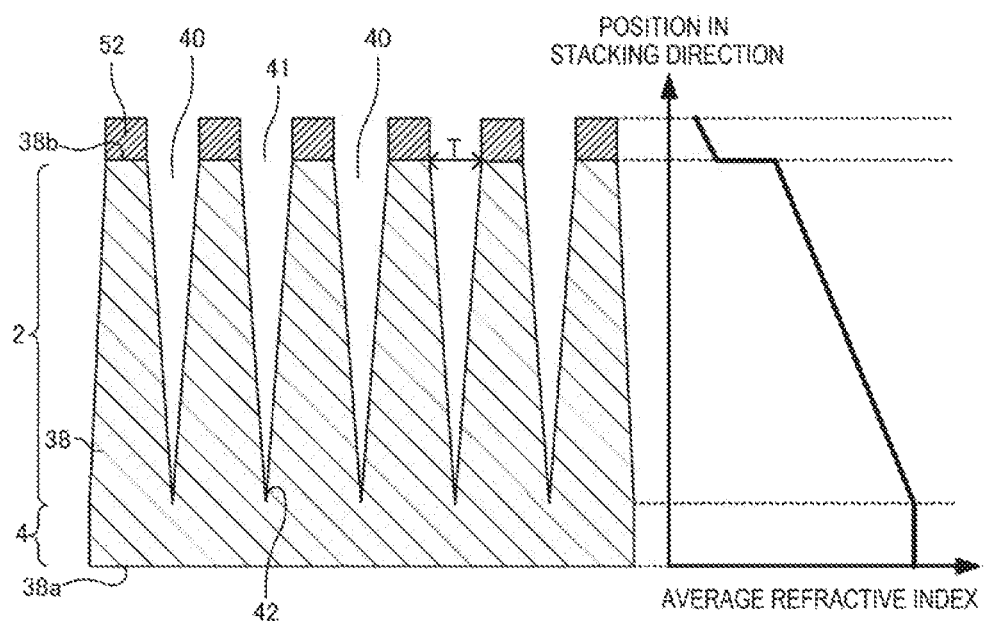
FIG. 8 is a cross-sectional view schematically showing a third semiconductor layer of the light emitting device according to the second embodiment.

Then, a light emitting device according to a second embodiment will be described with reference to the drawings. FIG. 7 is a cross-sectional view schematically showing the light emitting device 200 according to the second embodiment. FIG. 8 is a cross-sectional view schematically showing the third semiconductor layer 38 of the light emitting device 200. It should be noted that in FIG. 8, there is further illustrated a graph representing the distribution of the average refractive index of the third semiconductor layer 38 in the stacking direction.

Hereinafter, in the light emitting device 200 according to the second embodiment, the members having substantially the same functions as those of the constituent members of the light emitting device 100 according to the first embodiment described above will be denoted by the same reference symbols, and the detailed descriptions thereof will be omitted.

In the light emitting device 200, as shown in FIG. 7 and FIG. 8, the shape of the recessed part 40 is a circular cone, and the vertex of the circular cone forms the bottom 42 of the recessed part 40. Therefore, as shown in FIG. 8, the variation in average refractive index in the boundary between the area 2 where the recessed parts 40 are disposed and the area 4 where the recessed parts 40 are not disposed can be made small. Therefore, in the light emitting device 200, it is possible to increase the light extraction efficiency compared to the light emitting device 100.

It should be noted that although there is described above when the shape of the recessed part 40 is a circular cone, it is also possible to provide the recessed part 40 with a pyramidal shape and make the vertex of the pyramid form the bottom 42 of the recessed part 40. In this case, it is also possible to exert substantially the same function and advantage as when the shape of the recessed part 40 is a circular cone.

3. Third Embodiment

Figure 9:
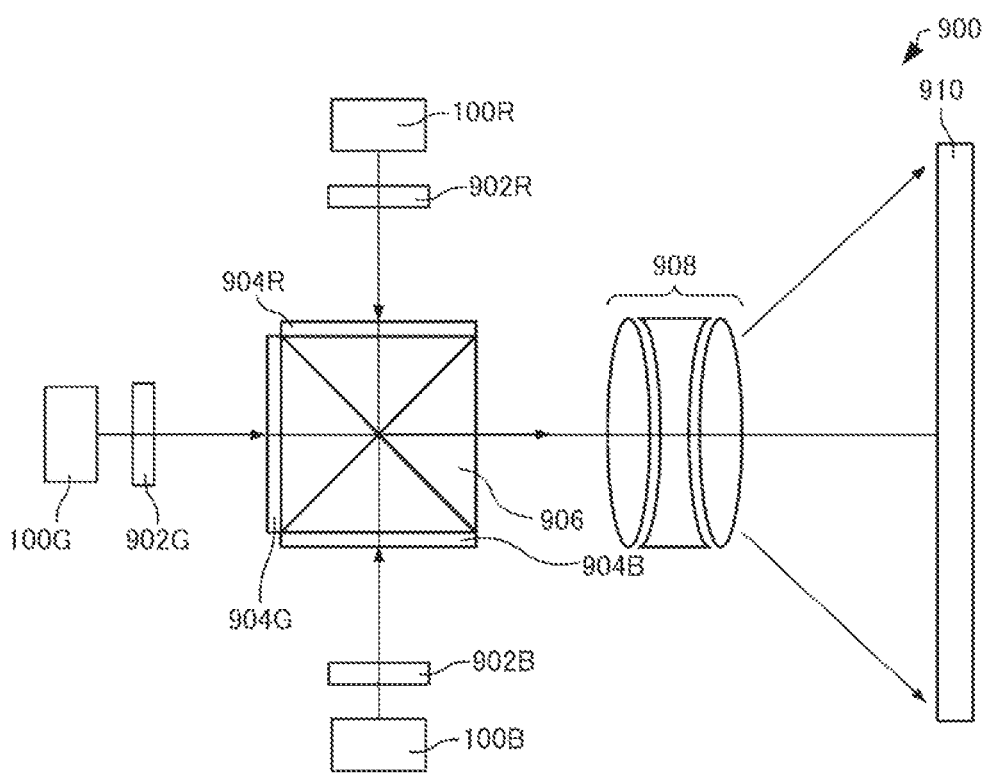
FIG. 9 is a diagram schematically showing a projector according to a third embodiment.

Then, a projector according to a third embodiment will be described with reference to the drawings. FIG. 9 is a diagram schematically showing the projector 900 according to the third embodiment.

The projector 900 has, for example, the light emitting device 100 as a light source.

The projector 900 includes a housing not shown, a red light source 100R, a green light source 100G, and a blue light source 100B which are disposed inside the housing, and respectively emit red light, green light, and blue light. It should be noted that in FIG. 9, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiments described above can also be used for other devices than projectors. As the applications other than projectors, there can be cited, for example, a light source of indoor and outdoor illumination, a backlight for a display, a laser printer, a scanner, an in-car light, sensing equipment using light, communication equipment, and so on.

In the present disclosure, some of the constituents can be omitted, or the embodiments and the modified example can be combined with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration means a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages, or configurations capable of achieving the same object as those of the configuration explained in the description of the embodiments. Further, the present disclosure includes configurations obtained by adding a known technology to the configuration explained in the description of the embodiments.

What is claimed is:

1. A light emitting device comprising:
a substrate; and
a laminated structure provided to the substrate, and including a plurality of columnar parts, wherein
each of the plurality of columnar parts includes
a first semiconductor layer,
a second semiconductor layer having different conductivity type from the first semiconductor layer, and
a light emitting layer disposed between the first semiconductor layer and the second semiconductor layer and configured to emit light,
the first semiconductor layer and the second semiconductor layer are cladding layers that are configured to confine the light in the light emitting layer,
the laminated structure includes a third semiconductor layer which is connected to an opposite side to the substrate of the second semiconductor layer, and has same conductivity type as the second semiconductor layer,
the second semiconductor layer is disposed between the light emitting layer and the third semiconductor layer,
the third semiconductor layer is provided with a recessed part, and the third semiconductor layer is a contact layer,
an opening of the recessed part is provided to a surface at an opposite side to the substrate of the third semiconductor layer,
a diametrical size in a bottom of the recessed part is smaller than a diametrical size in the opening of the recessed part,
a depth of the recessed part is smaller than a thickness of the third semiconductor layer,
an electrode is disposed at an opposite side to the substrate of the laminated structure, and
the electrode is electrically connected to the third semiconductor layer.

2. The light emitting device according to claim 1, wherein the electrode has a through hole penetrating the electrode at a position of the electrode overlapping the recessed part when viewed from a stacking direction of the laminated structure.

3. The light emitting device according to claim 1, wherein
a plurality of the recessed parts is provided,
the plurality of columnar parts is arranged in a first direction at a first pitch,
the plurality of the recessed parts is arranged in a second direction at a second pitch, and
the second pitch is shorter than the first pitch.

4. The light emitting device according to claim 1, wherein
the diametrical size in the opening of the recessed part is smaller than a diametrical size of each of the plurality of columnar parts.

5. The light emitting device according to claim 1, wherein
a shape of the recessed part is one of a circular cone and a pyramidal shape.

6. The light emitting device according to claim 1, wherein
a diametrical size of the recessed part decreases in a direction from the opening of the recessed part toward the bottom of the recessed part.

7. A projector comprising:
the light emitting device according to claim 1.

8. A display comprising:
the light emitting device according to claim 1.

9. A light emitting device comprising:
a substrate;
a laminated structure provided to the substrate, the laminated structure including a plurality of columnar parts, the plurality of columnar parts being a photonic crystal structure,
each of the plurality of columnar parts including:
a first semiconductor layer;
a second semiconductor layer having different conductivity type from the first semiconductor layer; and
a light emitting layer disposed between the first semiconductor layer and the second semiconductor layer, the light emitting layer emitting light; and
a third semiconductor layer disposed on the second semiconductor layer and having same conductivity type as the second semiconductor layer,
wherein the third semiconductor layer is provided with a plurality of recesses, the third semiconductor layer has a top surface and a bottom surface, and the bottom surface is closer to the second semiconductor layer than the top surface,
an opening of each of the plurality of recesses is provided in the top surface of the third semiconductor layer, and a bottom of each of the plurality of recesses is located adjacent to the bottom surface of the third semiconductor layer,
a diametrical size of the bottom of each of the plurality of recesses is smaller than a diametrical size of the opening of each of the plurality of recesses, and
an average refractive index with respect to the light emitted from the photonic crystal structure gradually increases from the top surface of the third semiconductor layer toward the bottom surface of the third semiconductor layer.

10. The light emitting device according to claim 9, further comprising:
an electrode disposed at an opposite side to the substrate of the laminated structure,
wherein the electrode has a plurality of through holes penetrating the electrode at positions of the electrode overlapping the plurality of recesses when viewed from a stacking direction of the laminated structure.

11. The light emitting device according to claim 9, wherein
the plurality of columnar parts is arranged in a first direction at a first pitch,
the plurality of recesses is arranged in a second direction at a second pitch, and
the second pitch is shorter than the first pitch.

12. The light emitting device according to claim 9, wherein
the diametrical size in the opening of each of the plurality of recesses is smaller than a diametrical size of each of the plurality of columnar parts.

13. The light emitting device according to claim 9, wherein
a shape of each of the plurality of recesses is one of a circular cone and a pyramidal shape.

14. The light emitting device according to claim 9, wherein
a diametrical size of each of the plurality of recesses decreases in a direction from the opening of each of the plurality of recesses toward the bottom of each of the plurality of recesses.

15. A projector comprising:
a light source having the light emitting device according to claim 9; and
an optical member receiving the light from the light emitting device and projecting the light.

16. A display comprising:
a light source having the light emitting device according to claim 9; and
an image forming device configured to perform scanning a surface of a screen with the light from the light emitting device.

\* \* \* \* \*